United States Patent [19]

Gaunt, Jr. et al.

[11] Patent Number: 4,486,876

[45] Date of Patent: Dec. 4, 1984

[54] BROADBAND TRANSMISSION ON LIMITED BANDWIDTH DIGITAL LINE

[75] Inventors: Wilmer B. Gaunt, Jr., Boxford; Michael R. Giammusso, Andover, both of Mass.

[73] Assignee: AT&T Bell Laboratories, Murray Hill, N.J.

[21] Appl. No.: 413,469

[22] Filed: Aug. 31, 1982

[51] Int. Cl.³ .......................... H04J 3/02; H04B 1/64
[52] U.S. Cl. ........................................... 370/7; 375/30
[58] Field of Search .......................... 370/7, 118, 109; 375/30; 333/14

[56] References Cited

PUBLICATIONS

"Digitale Tonprogrammübertragung Über 2048-K-Bits/s-Verbindungen", by Thoma, Rundfunktech Mitteilungen, Jan. 24, 1980, pp. 31–36.
International Conference on Digital Communications, Zurich, Switzerland, Mar. 9–11, 1976, "A Versatile Integrated Codec for PCM Systems", by Schoeff.
"Code Modulation with Digitally Controlled Companding for Speech Transmission", by Greefkes, Philips Technical Review, vol. 31, 1970, No. 11/12, pp. 335–353.
"A New Channel Bank with Block Companding" by Niwa et al., IEEE Transactions on Communications, vol. COM-30, No. 4, Apr. 1982.
Transmission Systems for Communications; Revised 4th Edition, Bell Telephone Labs., Inc.; Dec. 1971, pp. 580–583.
Digital Studio Transmission Links by Elie Fadel, Bayly Engineering Ltg., presented at N.A.B., Mar. 1977, Washington, D.C.

Primary Examiner—Douglas W. Olms
Attorney, Agent, or Firm—Joseph A. Cameron

[57] ABSTRACT

To insure timing recovery, T carrier requires that the signal contain no more than fifteen consecutive zeros and a "1"s density of at least one out of eight. When a 15 kHz audio program signal is converted into 12-bit words and four words inserted into six 8-bit time slots of the T1 line, timing recovery requirements have been met by using, in addition to an even parity bit, a dedicated "1" bit.

Here, instead of the usual eight chords, the compression characteristic used in generating the 12-bit words has only 7 chords, each represented by a combination of three chord bits that always includes at least one "1". This frees the dedicated "1" bit for additional coding detail. Centrally locating the chord bits within the 12-bit word further allows a mix of voice and program channels in the one channel bank.

In a disclosed implementation, the analog samples are first converted to 14-bit linear PCM words, and then digitally translated into 12-bit compressed words. The translator includes a ROM addressed by the most significant bits of the 14-bit words. Stored in the ROM at each such address is a table of 12 instruction words. The instruction words direct a switch to select each bit for the 12-bit word, whether to invert it, and whether to include it in parity.

9 Claims, 7 Drawing Figures

BROADBAND TRANSMISSION ON LIMITED BANDWIDTH DIGITAL LINE

CROSS REFERENCE TO RELATED APPLICATIONS

The following applications filed concurrently with this application disclose some of the same subject matter.

C. A. Sharper-1: Digital Code Translator
C. A. Sharper-2: Alarm Immune Program Signal

BACKGROUND OF THE INVENTION

This invention relates to digital transmission systems; in particular, it relates to the transmission of signals requiring more bandwidth than the typical signals for which the transmission system is primarily designed.

One situation requiring such broader bandwidth is the transmission of a music program signal over T carrier facilities. Studios and concert halls where the programs originate are often many miles from the transmitter. To design and maintain a custom transmission line to connect the studio and transmitter is expensive, and often prohibitively so. Broadband analog facilities capable of providing the service exist in the telephone network, however, usually only over heavy traffic routes. T carrier digital facilities, on the other hand, are becoming ubiquitous. T carrier is a pulse code modulated system (PCM) based upon 8-bit words and 8 kHz sampling. This allows faithful reproduction of 255 amplitude levels, and according to the Nyquist theorem, signal frequencies of 4 kHz bandwidth. A signal T1 line can carry 24 time-division-multiplexed channels of this definition. Understandably, this combination of levels and bandwidth per channel is considered inadequate for music channels. Nevertheless, more than adequate bandwidth is recognizably available if more than one channel space is used; there are, however, other restrictions. In order to insure timing recovery for the extant T1 repeaters, the average density of pulses, or "1"s must exceed one-out-of-eight bits and the signal must never consist of more than fifteen consecutive spaces or "zeros". These requirements are normally met by the standard $\mu255$ encoding with zero-code suppression which prevents the transmission of an 8-bit all zeros code word.

In the PC-79 digital studio link, manufactured by Bayly Engineering, Limited, Ajax, Ontario, Canada, and described in a brochure entitled "An Introduction to Digital Studio Transmission Links" the music is sampled at a 32 kHz rate. The samples are converted to 12-bit digital words, and four of the 12-bit words are inserted into six adjacent 8-bit time slots in a T carrier system. While this link functions to transmit a 15 kHz audio signal over the digital telephone network, it is less than optimal. In order to meet the timing recovery requirements, the eleventh bit of each 12-bit word is made a "1", and the twelfth bit is an even parity bit, guaranteeing at least two "1"s in every 12-bit word. That, however, leaves only ten bits for encoding the samples, i.e., 1,024 amplitude levels.

An object of this invention is an improved arrangement for transmitting broadband signals via digital facilities of limited bandwidth.

A second object is a digital audio program link for T carrier that makes more efficient use of the coding algorithm to satisfy timing recovery.

A third object is a digital program link that does not require a specific bit in every word to be a "1".

A fourth object of this invention is an improved digital studio link that uses eleven bits for encoding samples.

SUMMARY OF THE INVENTION

In the arrangement of the invention, converting and compressing means convert an input signal into compressed PCM words according to a compression characteristic having linear chords; a combination of chord bits in each compressed PCM word represents the particular chord. Each possible combination of chord bits comprises at least one "1". Bit positioning means locate the combination of chord bits centrally within the PCM word. A "1" is therefore guaranteed among the several central bits of each PCM word for timing recovery, yet no bit is wasted for this purpose. In a studio link for T carrier, the combination of three chord bits so comprised is located between the fifth and eighth bit positions of 12-bit compressed PCM words. When two 12-bit words are inserted into three 8-bit time slots, observation of the fifteen-consecutive-zero-maximum rule is guaranteed, even with a mix of voice and music channels on the one line.

BRIEF DESCRIPTION OF THE DRAWINGS

FIG. 1 is a block diagram of a system for inserting a broadband analog signal into a T carrier system, which may embody the invention.

FIG. 2 is a compression characteristic useful in implementing the invention.

FIG. 3 is a bit placement diagram illustrating the correspondence between 12-bit words arranged according to the invention and T carrier 8-bit time slots.

DETAILED DESCRIPTION

Figure 1:
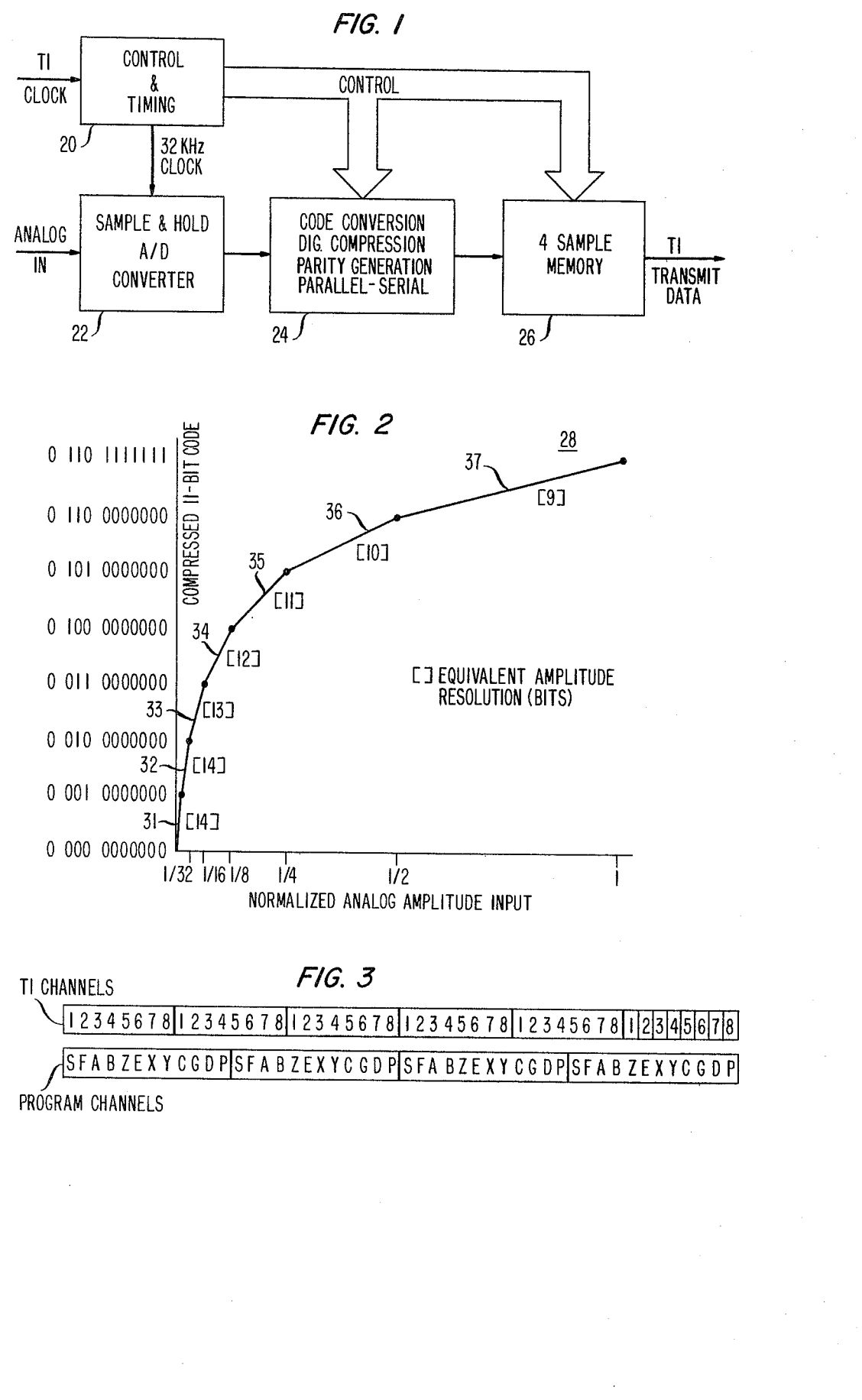
Figure 4:
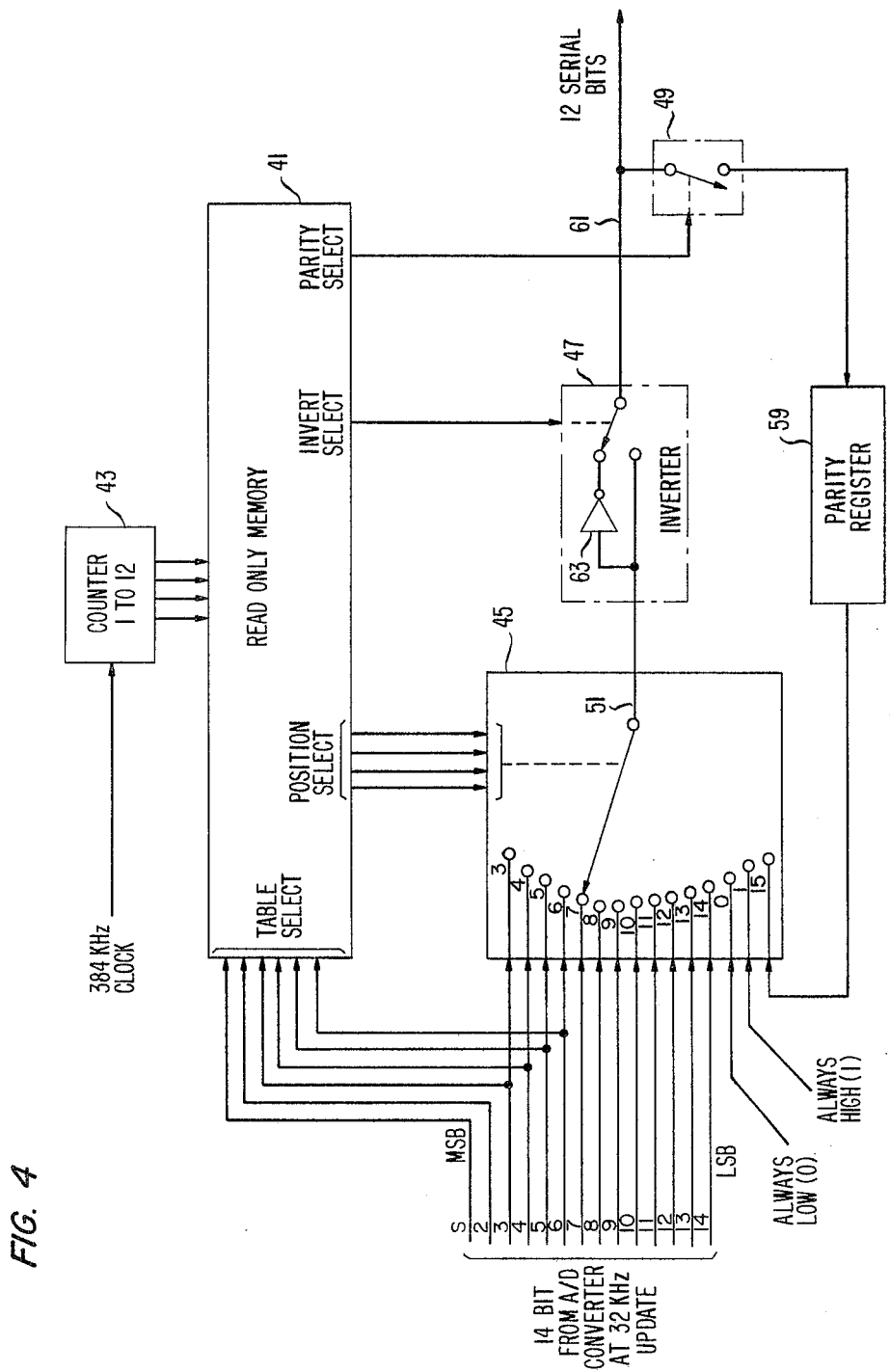
FIG. 4 is a functional block diagram of a code translator useful in practicing the invention.

To better explain the invention, we refer now to FIG. 1, which is a block diagram of an arrangement for preparing a broadband analog signal to use part of the capacity of a digital transmission system. In particular, it may be an arrangement for preparing a 15 kHz audio signal for transmission as part of the time-division-multiplexed signal of a T1 line.

In the arrangement of FIG. 1, a control and timing circuit 20 receives the 1.544 MHz clock from the T1 apparatus and generates therefrom various synchronized timing and control signals, including a 32 kHz clock signal. Sample and hold and analog-to-digital converter circuitry 22 samples the broadband analog signal at the 32 kHz rate, and encodes each sample, for example, into a 14-bit linear PCM word. Logic circuit 24, in accordance with the invention, compresses each 14-bit word into 11-bits, converts the code by rearranging the bit order, generates a parity bit to reflect the total number of 1's occurring over a predetermined number of bits in each compressed word and outputs each word one bit at a time. Memory 26 stores up to four 12-bit words and feeds them into six 8-bit time slots in each frame of the T1 line.

Because of a proper choice of compression characteristic and bit order according to the invention, ten bits of each 12-word can be used to encode the magnitude of the analog samples, leaving one bit for the sign of the samples and one bit for parity to control errors.

Compression characteristic 28 of FIG. 2 which may be used to implement the invention, describes the relationship between the normalized amplitude of the input samples and the corresponding compressed code bits that make up the digital word. While according to the block diagram of FIG. 1 compression characteristic 28 of FIG. 2 is generated from a linear encoded 14-bit signal by digital compression, it can also be created from the analog samples by other means, such as direct compressed encoding techniques. Characteristic 28 is made up of seven linear chords, 31 through 37, respectively, each identified by three chord bits. Although only the positive half of compression characteristic 28 is shown according to custom, it is understood that the negative half is symmetrical to that shown and lying in the third quadrant. Corresponding third quadrant chords therefore are identified by the same chord bits but the opposite sign bit. Since chords 31, 32 and their negative counterparts are co-linear, the four chords form a single segment, and the whole characteristic has eleven segments. Each chord is further divided by seven bits defining $2^7$, i.e., 128 steps. A positive sample of magnitude greater than one-half maximum, therefore, is encoded by chord 37 into an 11-bit word, the first four bits of which are 0110. Since seven bits are used to define one-half the maximum magnitude, the equivalent resolution of a linear code would be eight bits for total magnitude plus one sign bit, or therefore a 9-bit code. Similarly, a negative sample of less than 1/64 maximum magnitude is encoded according to segment 31 with an equivalent resolution of fourteen bits; the first four bits are 1000. The total number of voltage levels distinguishable by this characteristic is $128 \times 14 = 1,792$; this is a significant improvement over the 1,024 levels available when one bit in each word is forced to "1".

As mentioned, compression characteristic 28 may be generated by first encoding linearly and then digitally compressing. Table 1 shows a direct translation that effects the desired compression from a 14-bit linear code.

TABLE 1

| 14-BIT LINEAR | | 12-BIT COMPRESSED | | | |
|---|---|---|---|---|---|
| SIGN | MAGNITUDE | SIGN | CHORD | STEP | PARITY |
| S | 000000ABCDEFG | S | 000 | ABCDEFG | P |
| S | 000001ABCDEFG | S | 001 | ABCDEFG | P |
| S | 00001ABCDEFG- | S | 010 | ABCDEFG | P |
| S | 0001ABCDEFG-- | S | 011 | ABCDEFG | P |
| S | 001ABCDEFG--- | S | 100 | ABCDEFG | P |
| S | 01ABCDEFG---- | S | 101 | ABCDEFG | P |
| S | 1ABCDEFG----- | S | 110 | ABCDEFG | P |

The 12-bit compressed column is made up of the sign bit S, three chord bits, seven step bits, A through G, and a parity bit, P. Bits represented by dashes in the 14-bit linear column are discarded. As the magnitude of the signal increases, more bits are discarded, indicating coarser steps.

Piecewise linear compression coding characteristics are, of course, well known in the communication art. In fact, characteristic 28 is a member of the A-law family. What is unusual, however, is that there are only seven chords; normally three bits are used to identify eight chords. Here, however, there is no chord identified as 111.

It will be noted that according to the invention, the bits that identify each chord must contain at least one "1". Since this is for the purpose of timing recovery, it applies to the signal as transmitted. Music signals, as voice signals, however, normally include more soft than loud passages, and consequently, with most codecs, more zeros than 1's. In T carrier, it is normal practice in the digital channel bank to invert the whole encoded signal before transmission, thereby putting more energy into the line by increasing the 1's density. The characteristic 28 of FIG. 2 is labelled in anticipation of signal inversion before transmission. Thus, chord 31 is identified as 000 and there is no chord 111. Obviously, this produces the same result as omitting chord 000 and not inverting the signal. To minimize confusion, in the following discussion reference to the chord bits will be as transmitted over the T carrier line, with the understanding that signal inversion is an option that has no direct bearing on the invention.

With a "1" guaranteed in the chord identifying portion of each transmitted 12-bit word and another "1" to make even parity, timing recovery rules are met for a T1 line that contains all program channels. To take full advantage of a coding characteristic in which no 000 chord is transmitted, however, it remains to properly place the chord bits within the 12-bit word. Consider from Table 1 the generic 12-bit word S X Y Z A B C D E F G P, where X, Y and Z are the chord bits, all bits except P appear in the order of their significance. To satisfy the fifteen-consecutive-zero rule for timing recovery with a mix of program and voice channels, the XYZ chord bits are centrally located in the 12-bit word, that is, between the fifth and eighth-bit positions inclusively. FIG. 3 shows one such arrangement and the corresponding positions of the 8-bit time slots. With this arrangement, if the music channel happens to be located in the first time slots of a 24-channel digroup, and the twenty-fourth channel is a voice circuit, seven consecutive zeros from the voice circuit and one zero framing bit could precede the first 12-bit word. With the chord bits Z, X and Y in the fifth, seventh and eighth-bit positions, respectively, the first "1" in the 12-bit word could occur no later than the eighth-bit position, satisfying the fifteen-consecutive-zero maximum rule. Likewise, if the music channel falls in the last time slots, it could be followed by a zero framing bit and seven zeros in the following word. With a "1" guaranteed in no earlier than the fifth-bit position of the 12-bit word, however, the fifteen-zero rule is again satisfied. According to the invention, therefore, the compression characteristic guarantees a "1" in each 3-bit chord, and these chord bits are centrally located within the 12-bit word as transmitted. This arrangement guarantees satisfying the fifteen-consecutive-zero rule; T carrier timing recovery is therefore assured without dedicating a whole bit thereto. All eleven bits are available for sample coding, and performance is significantly improved.

The invention may be implemented in several ways including, for example, conventional custom integrated logic. To convert from a 14-bit linear code to the 12-bit compressed code of the invention, a memory look-up table can be used, where each possible linear word is an address with the corresponding compressed word stored thereat. A particularly useful code translator for performing the functions of block 24 of FIG. 1 to implement the invention, however, is illustrated in FIGS. 4 through 7, and is the subject of a separate application by C. A. Sharper, Case 1, filed concurrently with this application. According to the functional block diagram of FIG. 4, a read-only memory (ROM) 41 is addressed by the six most significant bits of the 14-bit linear code word from converter 22. At each of the sixty-four possible table select addresses of memory 41 is stored a table of twelve instruction words. A 1 to 12 counter 43 selects the twelve table entries in order, under control of a 384 kHz clock, which in turn is derived from the 1.544 MHz T1 timing. The table of twelve stored instruction words is therefore read out in order in response to each 14-bit input word representative of a single analog sample. Four bits of each output word of memory 41 address a bit selection switch 45; one bit addresses an inverter switch 47, and one bit addresses a parity switch 49. Bit selection switch 45 operates to selectively connect its output 51 to one of its inputs 0 through 15 under control of each output instruction word from memory 41. The inputs of switch 45 include the third through fourteenth bits of the linear code word from converter 22, an always low (zero) input 0, an always high (1) input 1 and the output 15 of a parity register 59. Inverter switch 47 selectively connects bit selector output 51 to code converter output 61 directly, or alternatively through an inverter 63. Parity switch 49 selectively connects code converter output 61 to the input of a parity register 59. In response to each 14-bit encoded sample input, therefore, ROM 41 utters twelve instruction words of six bits each. Each instruction word determines one output bit of the 12-bit compressed output word, whether that bit is inverted, and whether it is included in the parity check.

The ability to invert any bit is useful in certain kinds of code conversion. If the digital input to code converter 24, for example, is in offset-binary form, the most negative analog value has been encoded as all zeros and the most positive value as all 1's. Translating this to a sign-magnitude compressed code requires that the most significant bit be inverted to form the conventional sign bit. In addition, step bits must be inverted for negative signal samples to reflect negative increments from zero instead of positive increments. Chord bits, of course, are not inverted.

The parity check gives enough information to detect that one bit in a word is in error, but not enough information to determine which bit. The receiver, therefore, cannot correct the error but merely rejects the whole word representing one analog sample. If there is valid change in a more significant bit, therefore, and an error in a less significant bit, ignoring the entire word introduces a greater error than using it. It is useful, therefore, to take parity over only the most significant bits, ignoring the least significant.

In accordance with the bit order shown in FIG. 3, the first instructon word instructs switch 45 to select the sign bit S by connecting its output 51 to either input 0 or 1. It also instructs inverter switch 47 to connect input 51 directly to output 61, bypassing inverter 63, and switch 49 to connect parity register 59 to output 61 so that the sign bit is included in the parity check. In a similar manner, the second instruction word selects bit F. For this bit, output 51 is connected to inputs 8 through 13, depending upon the values of inputs S through 6, according to Table 1. If the input sign bit is zero, indicating in offset binary code a negative sample, the F bit is inverted by switch 47 and the parity switch 49 is open. Chord bits XY and Z are selected by the seventh, eighth and fifth instruction words, respectively, from inputs 0 and 1. In a notable exception, stored in the table select addresses 10000 and 011111 which represent the smallest magnitude signals in offset binary code, the fifth instructon word selects chord bit Z by connecting selector output 51 to input 7. This results in the proper chord, according to Table 1, but saves half of the memory space. It is possible because chords 31 and 32 are co-linear. Table 2 illustrates the twelve instruction words that may be stored at table select address 100000 implementing compression chord 31. It can readily be seen that no bits are inverted, that parity is taken over bits S X Y Z A B C P only, and that the Z bit is chosen from input 7. Including the parity bit in the calculation serves to reset it for the next sample. To complete the picture, Table 3 illustrates the instruction words stored at ROM address 010101 (in offset binary code) implementing chord 36 in the third quadrant. It can be seen that, according to Table 1, the least significant bit G of the output word is the tenth bit of the input word, that the seven step bits are inverted, and that, again, parity is taken over bits S X Y Z A B C P.

TABLE 2

INSTRUCTION WORDS STORED AT ROM ADDRESS 100000

| BIT | INPUT SELECT | ROM SELECT | OUTPUT INV | P |
|---|---|---|---|---|
| S | 0 | 0000 | 0 | 0 |
| F | 13 | 1101 | 0 | 1 |
| A | 8 | 1000 | 0 | 0 |
| B | 9 | 1001 | 0 | 0 |
| Z | 7 | 0111 | 0 | 0 |
| E | 12 | 1100 | 0 | 1 |
| X | 0 | 0000 | 0 | 0 |
| Y | 0 | 0000 | 0 | 0 |
| C | 10 | 1010 | 0 | 0 |
| G | 14 | 1110 | 0 | 1 |
| D | 11 | 1011 | 0 | 1 |
| P | 15 | 1111 | 0 | 0 |

TABLE 3

INSTRUCTION WORDS STORED AT ROM ADDRESS 010101

| BIT | INPUT SELECT | ROM SELECT | OUTPUT INV | P |
|---|---|---|---|---|
| S | 1 | 0001 | 0 | 0 |
| F | 9 | 1001 | 1 | 1 |
| A | 4 | 0100 | 1 | 0 |
| B | 5 | 0101 | 1 | 0 |
| Z | 1 | 0001 | 0 | 0 |
| E | 8 | 1000 | 1 | 1 |
| X | 1 | 0001 | 0 | 0 |
| Y | 0 | 0000 | 0 | 0 |
| C | 6 | 0110 | 1 | 0 |
| G | 10 | 1010 | 1 | 1 |
| D | 7 | 0111 | 1 | 1 |
| P | 15 | 1111 | 0 | 0 |

Figure 5:
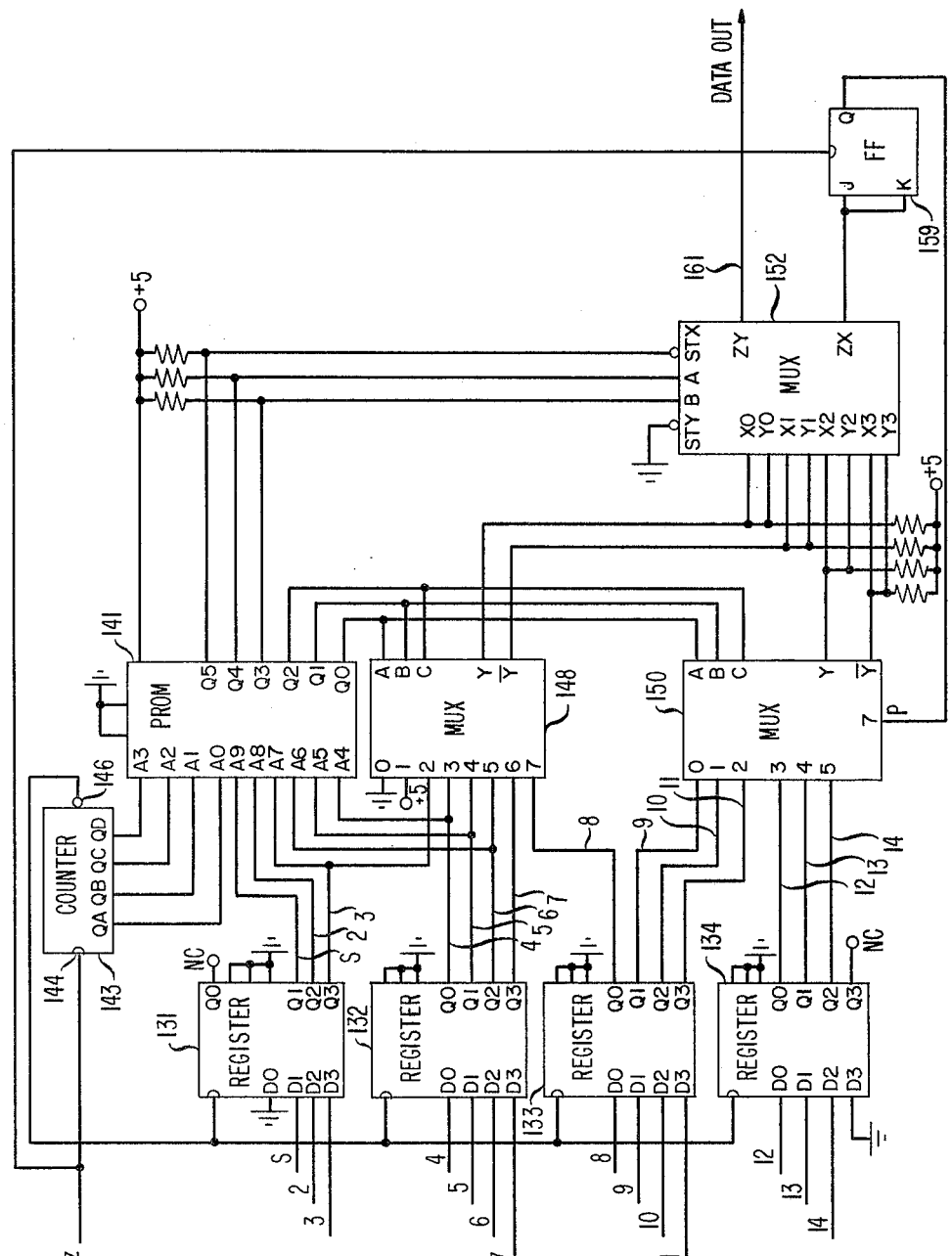
FIG. 5 is a schematic diagram of an embodiment of the translator of FIG. 4 using available hardware.

FIG. 5 is a schematic diagram illustrating a specific implementation of the code translator of FIG. 4 utilizing commercially available integrated circuits. In this circuit, four 4-bit registers 131, 132, 133, and 134, respectively, each have four input leads D0 through D3, four output leads, Q0 through Q3, and a clock input. The fourteen parallel outputs S through 14 from the analog-to-digital converter are connected to the D0 through D3 inputs of the four registers. Input D0 of register 131 may be connected to ground; for example, with the sign bit S connected to input D1, etc., and input D3 of register 134 may also be grounded. A 1 to 12 counter 143 has one input 144 connected to the 384 kHz clock signal, four outputs, QA, QB, QC and QD, upon which appear the combinational logic that counts from 1 to 12, and a carry output 146. A programmable read-only memory (PROM) 141 has ten address inputs A0 through A9 and six outputs Q0 through Q5. Address inputs A0 through A3 are connected to counter 143 outputs QA through QD, respectively. Address inputs A9, A8 and A7 are connected to register 131 outputs Q1, Q2 and Q3, respectively, and address inputs A6, A5 and A4 are connected to register 132 outputs Q0, Q1 and Q2, respectively. Counter carry output 146 is connected to the clock inputs of registers 131 through 134. Two 8 to 1 multiplexers 148 and 150, each have eight signal inputs 0 through 7, and three instruction inputs A, B and C, and two outputs, Y and $\overline{Y}$. Signal input 1 of multiplexer 148 is connected to the +5 volt source. Input 0 is connected to ground, and input 2 is connected to output Q3 of register 131. Inputs 3, 4, 5 and 6 of multiplexer 148 are connected to outputs Q0 through Q3, respectively of register 132, and input 7 is connected to output Q0 of register 133. Inputs 0, 1 and 2 of multiplexer 150 are connected to outputs Q1, Q2, and Q3, respectively of register 133, and inputs 3, 4, 5 of multiplexer 150 are connected to outputs Q0, Q1 and Q2, respectively, of register 134. Instruction inputs A, B and C of both multiplexers 148 and 150 are connected to outputs Q0, Q1 and Q2, respectively, of PROM 141. A dual 4 to 1 multiplexer 152 has signal inputs X0, Y0, X1, Y1, X2, Y2, X3 and Y3, and instruction inputs A, B, STX and STY. Multiplexer 152 also has two outputs, ZY and ZX. Instruction inputs A and B of multiplexer 152 are connected to outputs Q4 and Q3, respectively, of PROM 141. Input STY is connected to ground, and input STX is connected to output Q5 of PROM 141. Signal inputs X0 and Y0 are connected to output Y of multiplexer 148 and signal input X1 and Y1 are connected to output $\overline{Y}$ of multiplexer 148. Similarly, signal inputs X2 and Y2 and X3 and Y3 are connected to multiplexer 150 outputs Y and $\overline{Y}$, respectively. Finally, the code translator of FIG. 5 includes a JK flip-flop 159 which performs as a parity register. Output $Z_X$ of multiplexer 152 is connected to the J and K inputs of flip-flop 159, the Q output is connected to input 7 of multiplexer 150, and the clock input is connected to the 384 kHz clock signal.

In this specific implementation, registers 131 through 134 may be 4-bit registers in CMOS, supplied for example by Motorola under the code MC14076. PROM 141 may be 1KX8 capacity manufactured by Intel in NMOS under the code 2708. Multiplexers 148 and 150 can be purchased in TTL logic from T.I., coded 74LS151, and multiplexer 152 may be Motorola's dual 4-1 multiplexer MC14539 manufactured in CMOS. Counter 143 can utilize the commonly available chip 74LS161 in TTL logic. While this chip is capable of counting to 16, it is easily wired by those skilled in the art to count to 12.

Since multiplexer 152 is implemented in CMOS technology, its inputs that interface with NMOS (PROM 141) and TTL (multiplexers 148 and 150) are connected to the +5 volt source through 10K pull up resistors.

This circuit operates as follows: The four input registers 131 through 134 operate as a latch to hold in parallel form the 14-bit input words from the linear A to D converter. The first six bits, S through 6, form part of the address of PROM 141, the output of counter 143 forms the remainder of the address. The address bits, therefore, on A0 through A3, step through 12 changes at the 384 kHz rate, while those on leads A4 through A9 remain constant. The carry signal from counter 143 updates the 14-bit word as the counter resets. Twelve instruction words are therefore read out of PROM 141 on leads Q0 through Q5 for each input 14-bit word.

The outputs Y and $\overline{Y}$ of the multiplexers 148 and 150 are connected to specific inputs 0 through 7 according to the logic on the inputs A, B and C, that is, the first three bits of each instruction word stored in PROM 141. $\overline{Y}$, of course, is the inverse of Y.

The chip chosen for multiplexer 152 operates in this manner: When inputs STX and STY are low, outputs ZX and ZY are connected to the particular respective X and Y inputs indicated by the logic on inputs A and B. With input STY grounded, therefore, output ZY is always connected to a selected Y input, Y0 through Y3. Output ZX is connected to the selected X input only when a 0 appears on STX. Thus, the first five bits of each instruction word chosen a particular output bit and whether or not it is inverted. The sixth bit determines whether it is to be included in parity. The output Q of flip-flop 159 changes state with every "1" from output $Z_X$ of multiplexer 152. It forms the parity bit, which is the last bit of each 12-bit word fed out of output 161. It will be obvious that the order of the output bits, as well as the compression characteristic can readily be changed by changing the instruction words stored in PROM 141.

Figure 6:
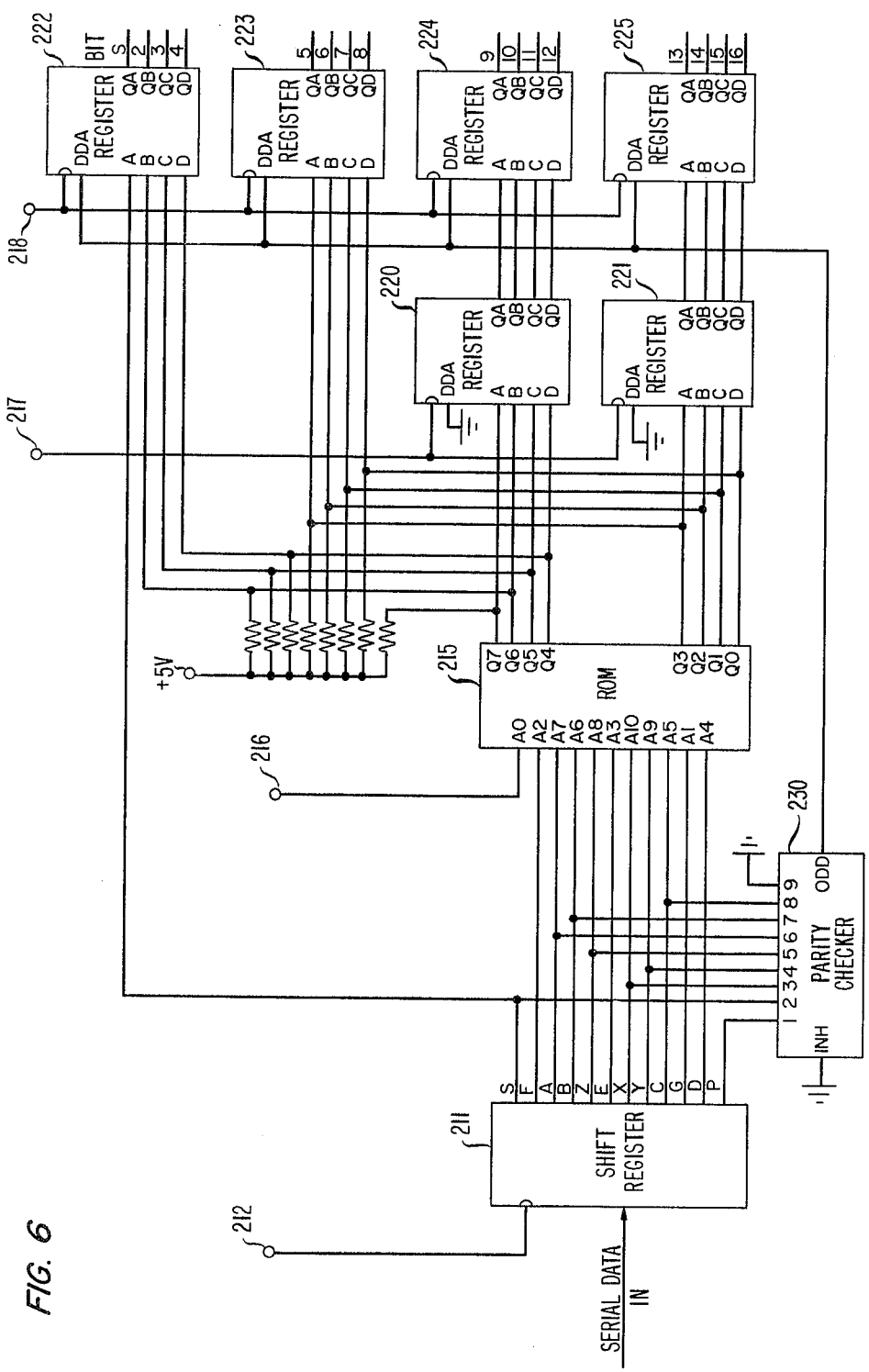
FIG. 6 is a schematic diagram of a circuit for reconverting a 12-bit compressed code to a 16-bit linear code.

When a broadband analog signal has been encoded, converted and compressed according to the invention, and transmitted via T carrier, a reverse process is required to reconvert the signal at the receiver back to linear form for digital-to-analog conversion. An adaptation of Sharper's switching translator could certainly be used for this puspose. On the other hand, for this expanding translator, in contrast to the compressing translator, a simple look-up table storing in read-only memory every possible word translation would not require a prohibitive amount of memory. FIG. 6 is a schematic diagram of an implementation of this technique using available hardware.

In this drawing, a 12-bit shift register 211 acts as a serial-to-parallel converter. It has one input to receive the compressed digital word in serial form and a clock input for receiving a control signal 212; 12 outputs emit the twelve bit word in parallel form. The outputs are labeled according to the respective bits they transmit. A read-only memory 215 has eleven address inputs A0 through A10 and eight outputs Q0 through Q7. The second through eleventh outputs of serial-to-parallel converter 211 are connected to address inputs A2 through A10 of memory 215 in reverse order of their significance. Bit X, therefore, the most significant chord bit, is connected to address input A10, bit Y to A9, etc., with bit G, the least significant transmitted bit, connected to address input A1. Address input A0 is connected to receive a control signal 216. Six 4-bit registers 220 through 225 each have four inputs A, B, C and D; four outputs QA, QB, QC and QD, a clock input and a disable input DDA. Memory outputs Q0, Q1, Q2 and Q3 are connected to inputs D, C, B and A, respectively, of both registers 221 and 223. Similarly, memory outputs Q4, Q5 and Q6 are connected to inputs D, C and B, respectively, of both registers 220 and 222. Memory output Q7 is connected to input A of register 220 and serial-to-parallel 211 output S is connected to input A of register 222. Outputs QA, QB, QC and QD of register 220 are connected to inputs A, B, C, and D, respectively, of register 224, and outputs QA, QB, QC and QD of register 221 are connected to inputs A, B, C and D, respectively, of register 225. A parity checker 230 has eight inputs, 1 through 8, and an output "odd". Input 1 is connected to output P of serial-to-parallel converter 211. Inputs 2 through 8 are connected to receive the seven most significant bits from the input word; that is, input 2 is connected to output S for the sign bit; input 3 to X, etc., and input 8 to output C of register 211. The output of parity checker 230 is connected to the disable input DDA of registers 222 through 225. The outputs of registers 222 through 225 contain the expanded linear digital word and are connected to the digital-to-analog converter. The output leads are labeled according to the bits they transmit, that is, S through 16. Finally, the clock input to registers 220 and 221 are connected to a control signal 217 and the clock inputs of registers 222 through 225 are connected to a control signal 218. The control signals are illustrated in FIG. 7.

To implement the expanding translator of FIG. 6, a 2KX8 PROM such as Intel 2716 may be used for memory 215; Motorola 4-bit register MC14076 is satisfactory for registers 220 through 225, and RCA parity checker 40101 is an excellent choice for parity checker 230. A number of available serial-in-parallel-out shift registers of sufficient capacity can be used for serial-to-parallel converter 211.

Since Intel PROM 2716 is designed to store 2,048 8-bit words, it can be used to emit two words for each of 1,024 input words. Registers 220 and 221 are used as latches to hold the first 8-bit output word for registers 224 and 225, respectively, and registers 222 and 223 discard the first 8-bit word and pass the second to make up 16-bit output words.

Figure 7:
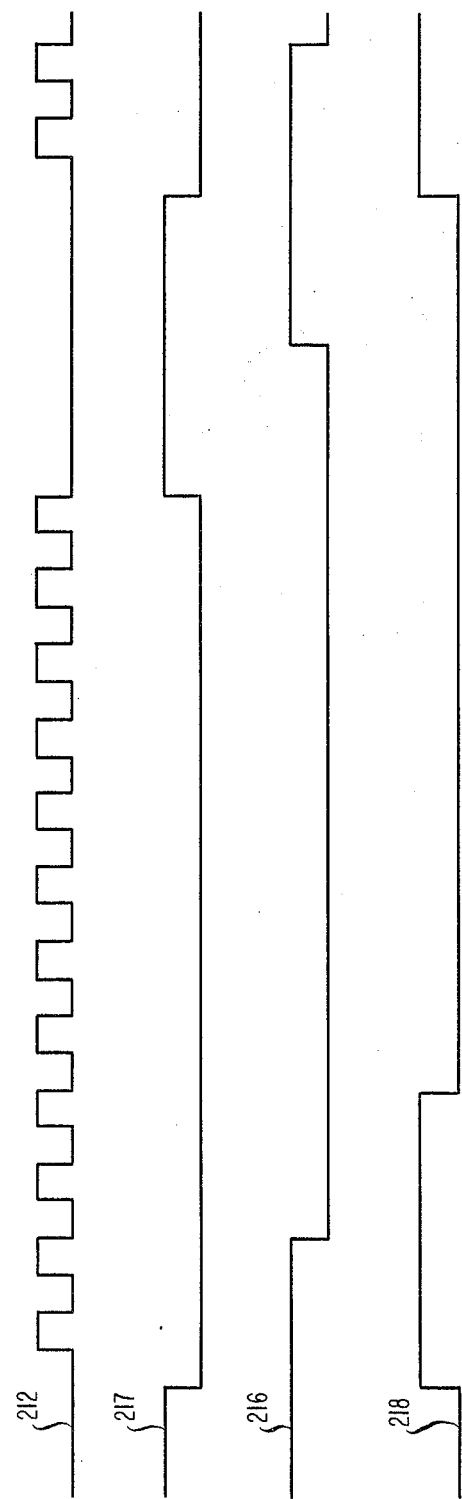
FIG. 7 is a set of waveforms useful in explaining the operation of the circuit of FIG. 6.

The sequence of operation can best be described in conjunction with the control waveforms of FIG. 7. Waveform 216 is an address input and, therefore, high is a "1", while low is a 0, while waveforms 212, 217 and 218 are clock waveforms with action occurring on the rising edge. The serial bits from the time division demultiplexing receiver, already re-inverted, are clocked into serial-to-parallel converter 211 by control signal 212. For a period before and shortly after all 12 bits have been clocked in, signal 216 is low, that is, a zero. This signal applied to address A0 of memory 215 evokes the output word of less significance, that is, bits 9 through 16. While memory 215 is so addressed, signal 217 goes high to clock that lesser significant word into latches 220 and 221. Signal 216 then goes high, addressing the more significant stored word in memory 216. While the memory is so addressed, signal 218 clocks into latches 222 through 225 the entire linear word, the eight most significant bits directly from memory 215, the eight least significant bits from latches 220 and 221.

Parity checker 230 receives the seven most significant bits from serial-to-parallel converter 211 plus the parity bit P. If the total number of "1"s in these bits is odd, indicating an error, a "1" appears on the output "odd". That "1" is applied to the disable input DDA of latches 222 through 225 to hold the previous output word one cycle.

Table 4 shows the translation from compressed 12-bit sign-magnitude code to linear 16-bit sign-magnitude code.

TABLE 4

| COMPRESSED TO LINEAR CONVERSION | |
|---|---|
| 11-BIT COMPRESSED SXYZABCDEFG | 16-BIT LINEAR 12345678910111213141516 |
| S000ABCDEFG | S000000AB C D E F G 1 0 |
| S001ABCDEFG | S000001AB C D E F G 1 0 |
| S010ABCDEFG | S00001ABC D E F G 1 0 0 |
| S011ABCDEFG | S0001ABCD E F G 1 0 0 0 |
| S100ABCDEFG | S001ABCDE F G 1 0 0 0 0 |
| S101ABCDEFG | S01ABCDEF G 1 0 0 0 0 0 |
| S110ABCDEFG | S1ABCDEFG 1 0 0 0 0 0 0 |

Since this translator contemplates an available linear, sign-magnitude 16-bit digital-to-analog converter, all sixteen bits are shown. Furthermore, there is no need to reinvert the step bits of negative samples.

A "1" bit is added after the G bit to provide an average value of ½ step, thereby minimizing quantizing noise.

Remembering that the sign bit is not used as an address bit, and that the least significant address bit into ROM 215 is that from signal 216, one of ordinary skill in the art can construct the contents of memory 215. For example, at the address: 0 1 1 0 1 0 1 0 1 0 0 (of the generic form X Y Z A B C D E F G 216) is stored the code word 1 0 1 0 1 0 0 0 to generate output bits 9 through 16, respectively. Similarly at address 0 1 1 0 1 0 1 0 1 0 1, the same address as above except for the signal 216, the stored word is X 0 0 0 1 0 1 0 for output bits 1 through 8, respectively. The "X" bit does not matter, since it's replaced by the sign bit.

We have thus described an arrangement that allows a broadband studio program signal to be transmitted over T carrier facilities making much more effective use of the available bandwidth for transmitting program information. At the same time, the minimum signal power for reliable timing recovery is guaranteed, without relying on any particular program content. It will be obvious that an 8 kHz program can be inserted into three T1 time slots using the invention in the same manner.

It will be further understood by those skilled in the art that while an audio program channel unit for T carrier was described in detail, our invention is not limited thereto. The principle of our invention can be applied to the compression of other signals in other formats for transmission over other facilities without departing from the spirit and scope of the invention.

What is claimed is:

1. An arrangement for providing timing recovery information in a PCM transmission system comprising:
    means for converting an input signal into compressed PCM words according to a compression characteristic having linear chords; each chord represented by a combination of chord bits comprising at least one "1", and
    means for centrally locating said chord bits within said PCM words.

2. An arrangement for transmitting over an n-bit pulse code modulated transmission system the information contained in amplitude samples of a broadband signal comprising, means for converting said samples into compressed m-bit PCM words according to a compression characteristic having linear chords; each chord represented by a combination of chord bits comprising at least one 1, means for positioning said chord bits centrally within said m-bit words, and means for inserting q of said m-bit words into rn-bit time slots in one frame of said PCM system wherein m is greater than n and q is less than r.

3. An arrangement for transmitting a broadband audio signal over an 8-bit pulse code modulated (PCM) transmission system comprising means for generating amplitude samples of said audio signal, means for converting said samples into compressed 12-bit PCM words according to a compression characteristic having linear chords, each chord represented by a combination of three chord bits comprising at least one "1", means for positioning said three chord bits between the 5th- and 8th-bit positions inclusive, in said 12-bit words, and means for inserting two of said 12-bit words into three 8-bit time slots in one frame of said PCM system.

4. An arrangement, as in claim 3, wherein said compression characteristic has 11 linear segments.

5. An arrangement, as in claim 3, wherein said converting means comprises linear analog-to-digital conversion means for converting said analog samples into PCM words longer than 11 bits and digital compression means for compressing said PCM words.

6. An arrangement, as in claim 3, wherein said 12-bit words comprise one parity bit.

7. An arrangement, as in claim 3, wherein said parity bit reflects even parity.

8. An arrangement, as in claim 6, wherein the parity reflected by said parity bit is taken over less than 10 bits.

9. An arrangement for transmitting an audio program signal over a multiplexed pulse code modulated transmission line having 8-bit time slots occurring at an 8 kHz rate comprising sampling means for sampling said program signal at a multiple of 8 kHz, means for converting the samples from said sampling means into 12-bit words compressed according to a compression characteristic having linear chords, each chord represented by a combination of 3 bits of said 12-bit words, and means for inserting more than one of said 12-bit words into more than two of said 8-bit time slots characterized in that said compression characteristic has seven chords and each combination of 3 chord bits representing a chord includes at least one "1".

* * * * *